(12) United States Patent
Tomita et al.

(10) Patent No.: US 10,283,626 B2
(45) Date of Patent: May 7, 2019

(54) SEMICONDUCTOR DEVICE AND MANUFACTURING METHOD OF THE SAME

(71) Applicant: TOYOTA JIDOSHA KABUSHIKI KAISHA, Toyota-shi, Aichi (JP)

(72) Inventors: Hidemoto Tomita, Toyota (JP); Masakazu Kanechika, Nagakute (JP); Hiroyuki Ueda, Nagakute (JP); Tomohiko Mori, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/671,452

(22) Filed: Aug. 8, 2017

(65) Prior Publication Data

US 2018/0090600 A1  Mar. 29, 2018

(30) Foreign Application Priority Data

Sep. 28, 2016 (JP) ................ 2016-189839

(51) Int. Cl.
*H01L 21/02* (2006.01)
*H01L 29/66* (2006.01)
(Continued)

(52) U.S. Cl.
CPC ........ *H01L 29/66916* (2013.01); *C30B 25/02* (2013.01); *C30B 29/406* (2013.01); *H01L 21/0243* (2013.01); *H01L 21/0254* (2013.01); *H01L 21/02381* (2013.01); *H01L 21/02458* (2013.01); *H01L 21/02576* (2013.01);
(Continued)

(58) Field of Classification Search
CPC ......... H01L 29/66916; H01L 29/66522; H01L 21/02579; H01L 21/02576; H01L 21/02381; H01L 29/66242; H01L 21/0254; H01L 21/02458; H01L 21/0243;
(Continued)

(56) References Cited

U.S. PATENT DOCUMENTS 7,211,839 B2   5/2007 Kachi et al.
2004/0157355 A1   8/2004 Kachi et al.
(Continued)

FOREIGN PATENT DOCUMENTS

JP   2004-260140 A   9/2004
JP   2010-045364 A   2/2010
(Continued)

*Primary Examiner* — Moin M Rahman
(74) *Attorney, Agent, or Firm* — Oliff PLC

(57) ABSTRACT

A semiconductor device may include a nitride semiconductor layer, an insulation gate section, and a heterojunction region, wherein the nitride semiconductor layer may include an n-type vertical drift region, a p-type channel region adjoining the vertical drift region, and an n-type source region separated from the vertical drift region by the channel region, wherein the insulation gate section is opposed to a portion of the channel region that separates the vertical drift region and the source region, the heterojunction region is in contact with at least a part of a portion of the vertical drift region that is disposed at the one of main surfaces, and the heterojunction region is an n-type nitride semiconductor or an i-type nitride semiconductor having a bandgap wider than a bandgap of the vertical drift region.

4 Claims, 6 Drawing Sheets

(51) Int. Cl.
  *C30B 25/02* (2006.01)
  *C30B 29/40* (2006.01)
  *H01L 29/778* (2006.01)
  *H01L 29/78* (2006.01)
  *H01L 29/10* (2006.01)
  *H01L 29/737* (2006.01)
  *H01L 29/20* (2006.01)

(52) U.S. Cl.
  CPC .... *H01L 21/02579* (2013.01); *H01L 29/1095* (2013.01); *H01L 29/66242* (2013.01); *H01L 29/66522* (2013.01); *H01L 29/66712* (2013.01); *H01L 29/7788* (2013.01); *H01L 29/7802* (2013.01); *H01L 29/7832* (2013.01); *H01L 29/1066* (2013.01); *H01L 29/2003* (2013.01); *H01L 29/737* (2013.01); *H01L 29/7787* (2013.01)

(58) Field of Classification Search
  CPC . H01L 29/737; H01L 29/7787; C30B 29/406; C30B 25/02
  See application file for complete search history.

(56) References Cited

U.S. PATENT DOCUMENTS

| | | |
|---|---|---|
| 2010/0038681 A1 | 2/2010 | Sugimoto et al. |
| 2013/0320400 A1* | 12/2013 | Hurkx .................. H01L 29/417 257/192 |
| 2015/0053999 A1 | 2/2015 | Kumagai |
| 2016/0343801 A1* | 11/2016 | Pilla ...................... H01L 29/063 |

FOREIGN PATENT DOCUMENTS

| | | |
|---|---|---|
| JP | 2015-041719 A | 3/2015 |
| WO | 2016/092031 A1 | 6/2016 |

* cited by examiner

SEMICONDUCTOR DEVICE AND MANUFACTURING METHOD OF THE SAME

TECHNICAL FIELD

A technique disclosed herein relates to a semiconductor device and a manufacturing method of the same.

BACKGROUND

A conventional semiconductor device 100 shown in FIG. 9 includes an n-type nitride semiconductor substrate 110, a nitride semiconductor layer 120 stacked on the nitride semiconductor substrate 110, a drain electrode 132 covering a rear surface of the nitride semiconductor substrate 110, a source electrode 134 covering a front surface of the nitride semiconductor layer 120, and an insulation gate section 136 provided on a part of the front surface of the nitride semiconductor layer 120. The nitride semiconductor layer 120 includes an n-type drift region 121, p-type base regions 122, p-type channel regions 123, p-type contact regions 124, and n-type source regions 125. The drift region 121 is constituted of a horizontal drift region 121a and a vertical drift region 121b, and the vertical drift region 121b is at the front surface of the nitride semiconductor layer 120. Herein, the vertical drift region 121b may be referred to especially as a JFET region.

Each of the base regions 122 is disposed between the horizontal drift region 121a and a corresponding one of the channel regions 123, contains p-type impurities in high concentration, and is provided to suppress the corresponding channel region 123 from being punched through when the semiconductor device 100 is off. Each of the channel regions 123 is disposed at a position adjoining the vertical drift region 121b and situated at the front surface of the nitride semiconductor layer 120. Each of the contact regions 124 is disposed at the front surface of the nitride semiconductor layer 120 and electrically connected to the source electrode 134. Each of the source regions 125 is separated from the vertical drift region 121b by a corresponding one of the channel regions 123, disposed at the front surface of the nitride semiconductor layer 120, and electrically connected to the source electrode 134. A gate electrode 136b of the insulation gate section 136 is opposed to, via a gate insulation film 136a, a portion of each channel region 123 which separates the vertical drift region 121b and the corresponding source region 125. The gate electrode 136b of the insulation gate section 136 is electrically isolated and separated from the source electrode 134 by an interlayer insulation film 152.

When the semiconductor device 100 is on, an inversion layer is formed by a potential of the gate electrode 136b in the portion of each channel region 123 which separates the vertical drift region 121b and the corresponding source region 125, and electrons flow into the vertical drift region 121b from the source regions 125 through the inversion layers. The electrons that have flown into the vertical drift region 121b flow in the vertical drift region 121b in a vertical direction toward the drain electrode 132. Due to this, the drain electrode 132 and the source electrode 134 are electrically connected.

When the semiconductor device 100 is off, a depletion layer extends from each base region 122 and each channel region 123 into the vertical drift region 121b. The vertical drift region 121b is designed to turn into a pinch-off state where the depletion layers extending from its both sides connect to each other, during the semiconductor device 100 being off. Due to the vertical drift region 121b being pinched off electric field applied to the gate insulation film 136a of the insulation gate section 136 is alleviated, dielectric breakdown of the gate insulation film 136a is suppressed, and a breakdown voltage of the semiconductor device 100 is improved. It should be noted that when the semiconductor device 100 turns on, a potential of the vertical drift region 121b and a potential of the base regions 122 and the channel regions 123 become substantially equal, and the depletion layers disappear. A JFET structure is constituted of the n-type vertical drift region 121b and the p-type base regions 122, and another JFET structure is constituted of the n-type vertical drift region 121b and the p-type channel regions 123. Japanese Patent Application Publication No. 2015-041719 discloses an example of a semiconductor device including a vertical drift region (i.e., JFET region).

SUMMARY

In order to suppress the dielectric breakdown of the gate insulation film 136a by the vertical drift region 121b being favorably pinched off when the semiconductor device 100 is off, it is preferable to set an impurity concentration of the vertical drift region 121b low. However, if the impurity concentration of the vertical drift region 121b is low, electrical resistance of the vertical drift region 121b becomes high, and on-resistance of the semiconductor device 100 increases.

As described above, a semiconductor device including a vertical drift region has a trade-off relation between its breakdown voltage and on-resistance. Especially, a semiconductor device using a nitride semiconductor includes a nitride semiconductor layer designed to be relatively thin and is used under a condition where high electric field is applied to its gate insulation film in order to allow high dielectric breakdown field which is a property of a nitride semiconductor to be sufficiently exerted. Therefore, especially for a semiconductor device using a nitride semiconductor, a technique of improving the aforementioned trade-off relation has been desired to be developed.

A semiconductor device disclosed herein may comprise a nitride semiconductor layer; an insulation gate section provided on a part of one of main surfaces of the nitride semiconductor layer, and a heterojunction region provided on another part of the one of main surfaces. The nitride semiconductor layer may include an n-type vertical drift region disposed at the one of main surfaces; a p-type channel region adjoining the vertical drift region, and disposed at the one of main surfaces; and an n-type source region separated from the vertical drift region by the channel region, and disposed at the one of main surfaces. The insulation gate section is opposed to a portion of the channel region that separates the vertical drift region and the source region. The heterojunction region is in contact with at least a part of a portion of the vertical drift region that is disposed at the one of main surfaces, and the heterojunction region is an n-type nitride semiconductor or an i-type nitride semiconductor having a bandgap wider than a bandgap of the vertical drift region.

In the aforementioned semiconductor device, the vertical drift region and the heterojunction region are in heterojunction with each other, and two-dimensional electron gas is generated in a front surface portion of the vertical drift region. Since electron carriers are present in high concentration in the two-dimensional electron gas, an electric resistance in the front surface portion of the vertical drift region greatly decreases. Due to this, an on-resistance of the semiconductor device decreases. In other words, the aforementioned semiconductor device can have a low on-resistance, even when an impurity concentration of the vertical drift region is set low to favorably pinch off the vertical drift region. As such, the aforementioned semiconductor device can improve the trade-off relation between its breakdown voltage and on-resistance.

A manufacturing method of a semiconductor device disclosed herein may comprise forming a heterojunction layer on one of main surfaces of an n-type nitride semiconductor layer, the heterojunction layer being an n-type nitride semiconductor or an i-type nitride semiconductor which has a bandgap wider than a bandgap of the nitride semiconductor layer; etching a part of the heterojunction layer so as to form a heterojunction region being in heterojunction with the nitride semiconductor layer, and so as to expose the one of main surfaces at a position adjoining the heterojunction region; forming a channel region at the one of main surfaces by radiating p-type impurities to the one of main surfaces that was exposed in the etching, forming a source region at the one of main surfaces by radiating n-type impurities to a part of the nitride semiconductor layer disposed at the one of main surfaces within the channel region; and forming an insulation gate section on the one of main surfaces, the insulation gate section being opposed to a portion of the channel region that separates the heterojunction region and the source region.

According to the aforementioned manufacturing method of a semiconductor device, by forming the channel region at the position adjoining the heterojunction region which was left in the etching, a vertical drift region can be formed selectively under the left heterojunction region. In other words, the heterojunction region can be formed selectively on a main surface of the vertical drift region. As described above, according to the aforementioned manufacturing method of the semiconductor device, the vertical drift region and the heterojunction region can be easily aligned with each other.

DETAILED DESCRIPTION

Embodiment

Figure 1:
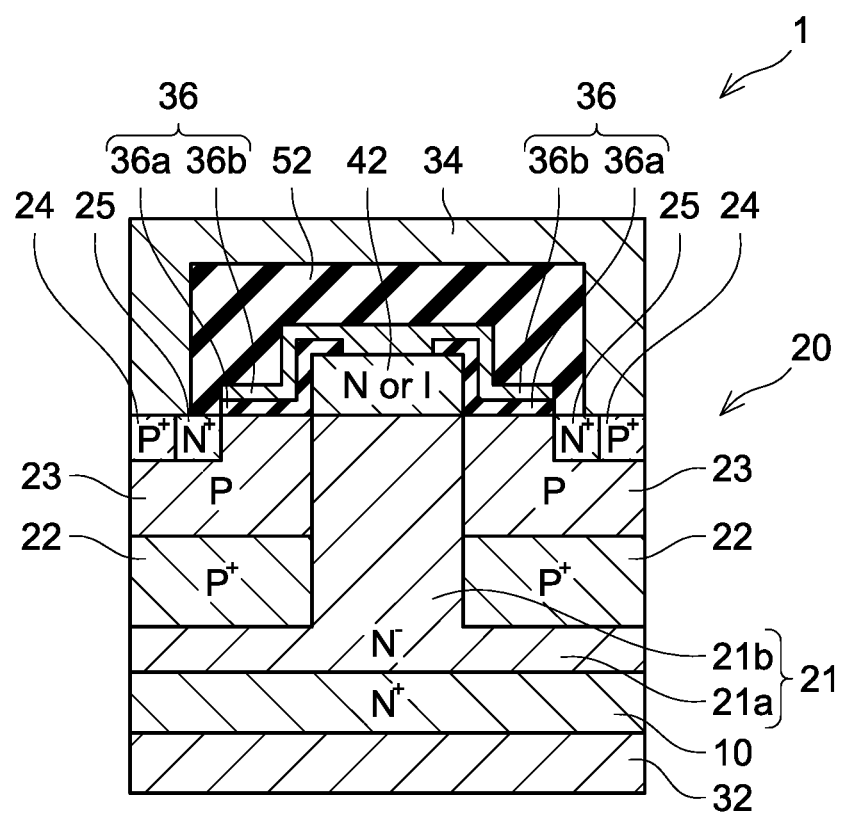
FIG. 1 schematically shows a cross sectional view of a main part of a semiconductor device.

As shown in FIG. 1, a semiconductor device 1 comprises an n-type nitride semiconductor substrate 10, a nitride semiconductor layer 20 stacked on the nitride semiconductor substrate 10, a heterojunction region 42 stacked on a part of a front surface of the nitride semiconductor layer 20, a drain electrode 32 covering a rear surface of the nitride semiconductor substrate 10, a source electrode 34 covering the front surface of the nitride semiconductor layer 20, and an insulation gate section 36 provided on a part of the front surface of the nitride semiconductor layer 20. The nitride semiconductor layer 20 comprises an n-type drift region 21, p-type base regions 22, p-type channel regions 23, p-type contact regions 24, and n-type source regions 25. The drift region 21 is constituted of a horizontal drift region 21a and a vertical drift region 21b, and the vertical drift region 21b is disposed at the front surface of the nitride semiconductor layer 20. The heterojunction region 42 is not a part of the nitride semiconductor layer 20, but provided on a part of an upper one of main surfaces of the nitride semiconductor layer 20.

The nitride semiconductor substrate 10 is made of gallium nitride (GaN) containing n-type impurities in high concentration. The drain electrode 32 is in ohmic contact with an entirety of the rear surface of the nitride semiconductor substrate 10. The nitride semiconductor substrate 10 is a base substrate on which the nitride semiconductor layer 20 epitaxially grows.

The nitride semiconductor layer 20 is deposited by epitaxial growth on the nitride semiconductor substrate 10. The nitride semiconductor layer 20 is made of gallium nitride (GaN) containing n-type impurities in lower concentration than that of the nitride semiconductor substrate 10. The nitride semiconductor layer 20 is provided with plural types of diffusion regions to be described later.

The drift region 21 is constituted as a remaining portion after the plural types of diffusion regions have been formed in the nitride semiconductor layer 20, and comprises the horizontal drift region 21a and the vertical drift region 21b. The horizontal drift region 21a is disposed on the nitride semiconductor substrate 10. The vertical drift region 21b is disposed on the horizontal drift region 21a so as to have a convex shape protruding vertically upward therefrom, and is at a part of the front surface of the nitride semiconductor layer 20. As seen along a direction perpendicular to the front surface of the nitride semiconductor layer 20 (an up-and-down direction on a sheet surface of the drawing), the vertical drift region 21b extends linearly along a longitudinal direction (a direction perpendicular to the sheet surface of the drawing).

Each of the base regions 22 is disposed between the horizontal drift region 21a and a corresponding one of the channel regions 23, and on a corresponding side of the vertical drift region 21b. The base regions 22 contain p-type impurities in higher concentration than the channel regions 23, and are provided to suppress the channel regions 23 from being punched through when the semiconductor device 1 is off. The base regions 22 are formed by radiating magnesium to the front surface of the nitride semiconductor layer 20, using ion implantation technique.

Each of the channel regions 23 is disposed on a corresponding one of the base regions 22 and on a corresponding side of the vertical drift region 21b, and at the front surface of the nitride semiconductor layer 20. The channel regions 23 are formed by radiating magnesium to the front surface of the nitride semiconductor layer 20, using ion implantation technique.

The contact regions 24 are disposed on the channel regions 23, and at the front surface of the nitride semiconductor layer 20. The contact regions 24 contain p-type impurities in high concentration, and are in ohmic contact with the source electrode 34. The contact regions 24 are formed by radiating magnesium to the front surface of the nitride semiconductor layer 20, using ion implantation technique.

The source regions 25 are disposed on the channel regions 23, separated from the drift region 21 by the respective channel regions 23, and disposed at the front surface of the nitride semiconductor layer 20. The source regions 25 contain n-type impurities in high concentration, and are in ohmic contact with the source electrode 34. The source regions 25 are formed by radiating silicon to the front surface of the nitride semiconductor layer 20, using ion implantation technique.

The heterojunction region 42 is provided on a part of the front surface of the nitride semiconductor layer 20. Precisely, the heterojunction region 42 is provided so as to contact an entirety of a portion of the vertical drift region 21b that is situated at the front surface of the nitride semiconductor layer 20. The heterojunction region 42 is made of n-type or i-type aluminum gallium nitride (AlGaN). Since the heterojunction region 42 is made of aluminum gallium nitride (AGaN) and the vertical drift region 21b is made of gallium nitride (GaN), the heterojunction region 42 and the vertical drift region 21b are in heterojunction with each other. Due to this, two-dimensional electron gas (2DEG) is generated in a front surface portion of the vertical drift region 21b. It should be noted that the heterojunction region 42 may be made of zinc aluminum gallium nitride (ZnAlGaN).

The insulation gate section 36 is provided on a part of the front surface of the nitride semiconductor layer 20, and comprises a gate insulation film 36a made of oxide silicon and a gate electrode 36b made of polysilicon. Specifically, the gate insulation film 36a covers surfaces of portions of the channel regions 23 each of which separates the vertical drift region 21b and the corresponding source region 25, a side surface of the heterojunction region 42, and a part of a front surface of the heterojunction region 42. The gate electrode 36b is opposed to, via the gate insulation film 36a, the portion of the corresponding channel region 23 that separates the vertical drift region 21b and the corresponding source region 25 as well as is in contact with the surface of the heterojunction region 42 via a gap in the gate insulation film 36a. It should be noted that the gate electrode 36b may not be in contact with the heterojunction region 42 as needed. The gate electrode 36b is electrically isolated and separated from the source electrode 34 by the interlayer insulation film 52.

Next, an operation of the semiconductor device 1 will be described. When the semiconductor device 1 is used, a positive voltage is applied to the drain electrode 32, and the source electrode 34 is grounded. When a positive voltage higher than a gate threshold value is applied to the gate electrode 36b, an inversion layer is formed in the portion of each channel region 23 that separates the vertical drift region 21b and the corresponding source region 25, and the semiconductor device 1 turns on. At this occasion, electrons flow into the vertical drift region 21b from the source regions 25 through the inversion layers. The electrons that have flown into the vertical drift region 21b flow through the vertical drift region 21b in a vertical direction toward the drain electrode 32. Due to this, the drain electrode 32 and the source electrode 34 are electrically connected. When the semiconductor device 1 is on, two-dimensional electron gas is generated in the front surface portion of the vertical drift region 21b. Since electron carriers are present in high concentration in the two-dimensional electron gas, an electric resistance in the front surface portion of the vertical drift region 21b greatly decreases. Due to this, an on-resistance of the semiconductor device 1 decreases.

When the gate electrode 36b is grounded, the inversion layers disappear, and the 16 semiconductor device 1 turns off. At this occasion, a depletion layer starts to extend from each base region 22 and each channel region 23 into the vertical drift region 21b. The vertical drift region 21b turns into a pinch-off state where the depletion layers extending from its both sides connect to each other. Due to the vertical drift region 21b being pinched off, electric field applied to the gate insulation films 36a of the insulation gate section 36 is alleviated, dielectric breakdown of the gate insulation films 36a is suppressed, and the semiconductor device 1 can have a high breakdown voltage.

In the semiconductor device 1, an impurity concentration of the vertical drift region 21b is low in order to favorably pinch off the vertical drift region 21b. In this case, an electric resistance based on the impurity concentration of the vertical drift region 21b becomes high. However, in the semiconductor device 1, as described above, the two-dimensional electron gas including electron carriers in high concentration is generated in the front surface portion of the vertical drift region 21b, and the semiconductor device 1 thereby can have a low on-resistance. That is, even when the impurity concentration of the vertical drift region 21b is set low in order to favorably pinch off the vertical drift region 21b, the semiconductor device 1 can have a low on-resistance. As a result, the semiconductor device 1 can improve a trade-off relation between its breakdown voltage and on-resistance.

Figure 9:
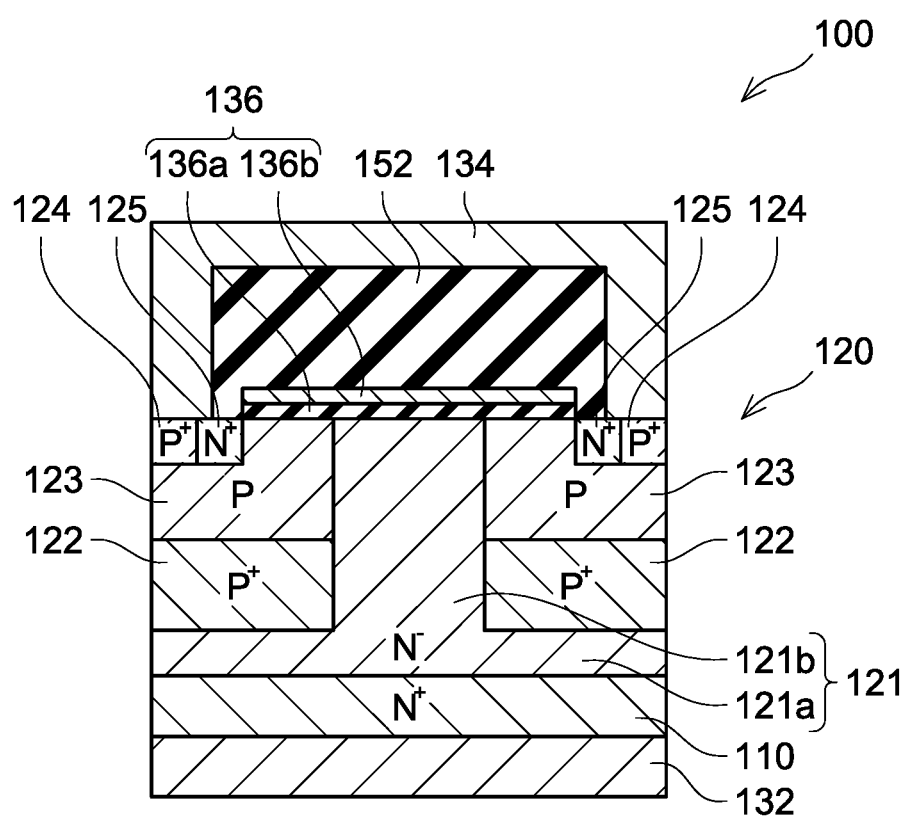
FIG. 9 schematically shows a cross sectional view of a main part of a conventional semiconductor device.

Further, as is apparent by comparison with a conventional semiconductor device 100 shown in FIG. 9, the gate insulation films 36a are not present on a surface of the vertical drift region 21b in the semiconductor device 1. Due to this, the problem of dielectric breakdown of the gate insulation films 36a at that part never exists. In this regard as well, the semiconductor device 1 can have a high breakdown voltage.

The semiconductor device 1 may be driven such that a negative voltage is applied to the gate electrode 36b when the semiconductor device 1 is off. In this case, it is possible to cause the two-dimensional electron gas to disappear when the semiconductor device 1 is off, and thus the vertical drift region 21b can be pinched off more favorably.

Figure 2:
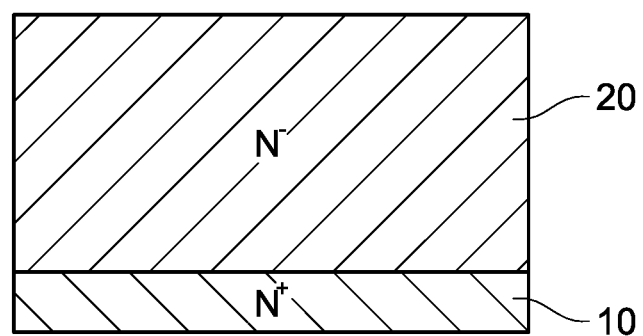
FIG. 2 schematically shows the cross sectional view of the main part of the semiconductor device in a manufacturing process of the semiconductor device.

Next, a manufacturing method of the semiconductor device 1 will be described. Firstly, as shown in FIG. 2, a nitride semiconductor layer 20 is deposited on a front surface of the nitride semiconductor substrate 10, using epitaxial growth technique.

Figure 3:
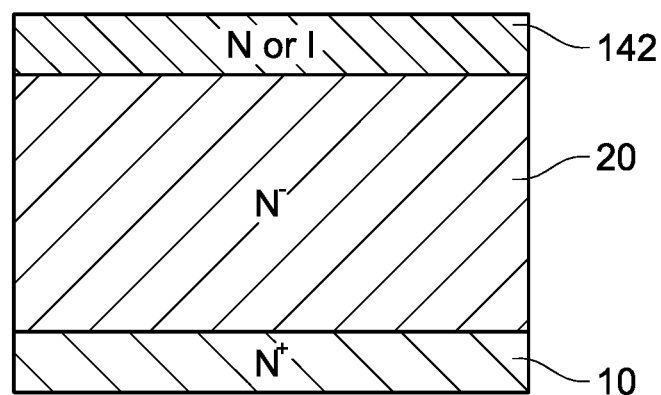
FIG. 3 schematically shows the cross sectional view of the main part of the semiconductor device in a manufacturing process of the semiconductor device.

Next, as shown in FIG. 3, a heterojunction layer 142 is deposited on the front surface of the nitride semiconductor layer 20, using epitaxial growth technique.

Figure 4:
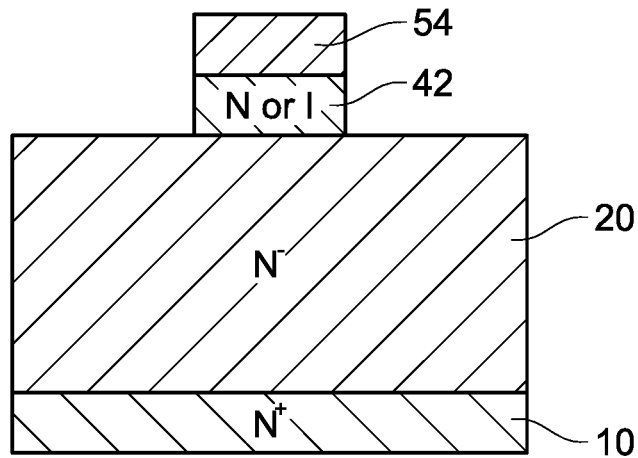
FIG. 4 schematically shows the cross sectional view of the main part of the semiconductor device in a manufacturing process of the semiconductor device.

Next, as shown in FIG. 4, patterning with a mask 54 is performed onto a front surface of the heterojunction layer 142, and a part of the heterojunction layer 142 is etched. Due to this, the heterojunction region 42 is left on a part of the front surface of the nitride semiconductor layer 20, and the front surface of the nitride semiconductor layer 20 that is located on both sides of the heterojunction region 42 is exposed.

Figure 5:
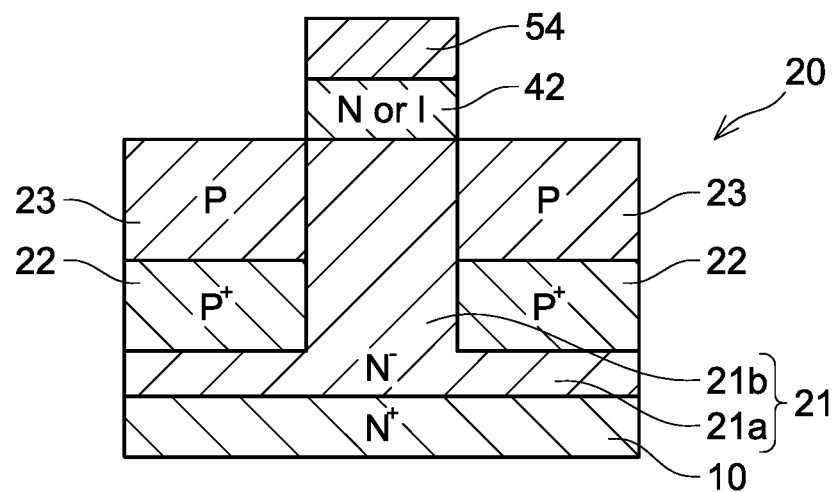
FIG. 5 schematically shows the cross sectional view of the main part of the semiconductor device in a manufacturing process of the semiconductor device.

Next, as shown in FIG. 5, magnesium is radiated toward the exposed front surface of the nitride semiconductor layer 20, with the mask 54 remaining as it is, using ion implantation technique. The base regions 22 and the channel regions 23 are formed by adjusting an implantation range and an implantation amount of magnesium upon the ion implantation. By using the same mask 54 in the process where the front surface of the nitride semiconductor layer 20 is exposed by etching the heterojunction layer 142 and in the process where the base regions 22 and the channel regions 23 are formed as described above, the vertical drift region 21b can be formed selectively under the heterojunction region 42 which is left. In other words, the heterojunction region 42 can be formed selectively on the surface of the vertical drift region 21b. Using the same mask 54 in both of the processes as such facilitates an alignment between the vertical drift region 21b and the heterojunction region 42.

Figure 6:
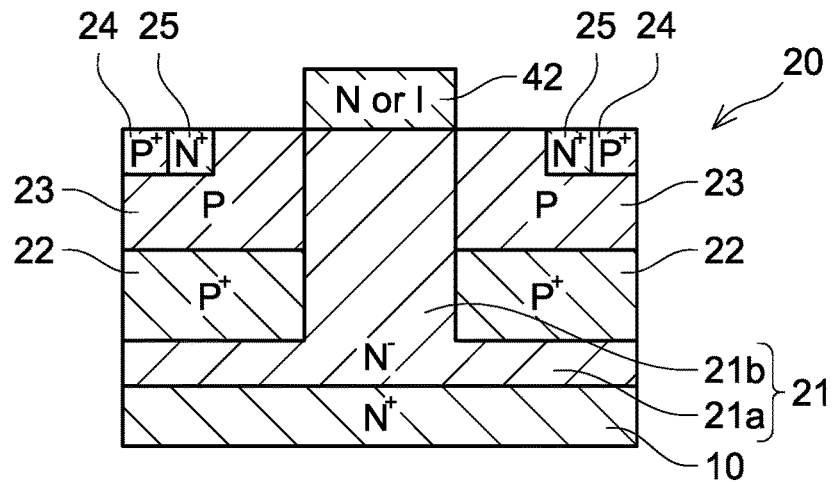
FIG. 6 schematically shows the cross sectional view of the main part of the semiconductor device in a manufacturing process of the semiconductor device.
Figure 7:
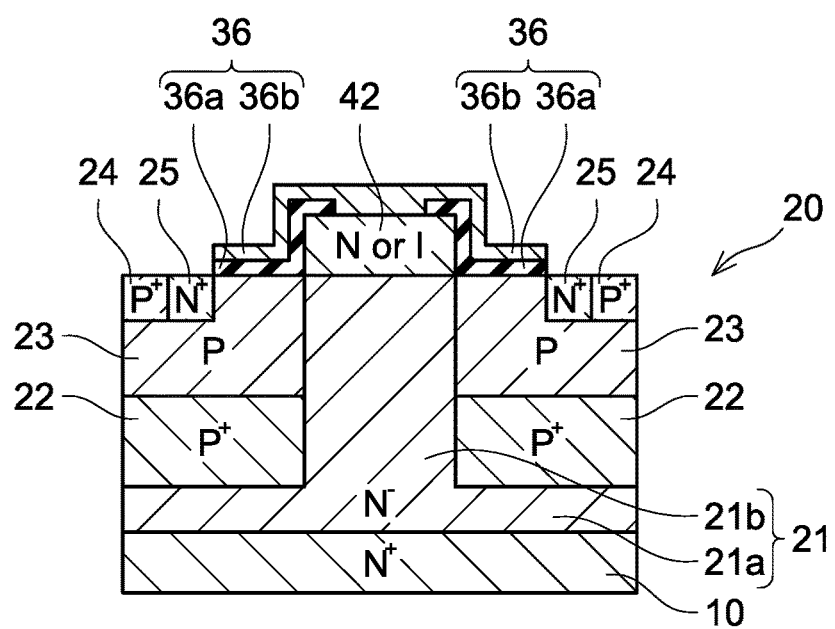
FIG. 7 schematically shows the cross sectional view of the main part of the semiconductor device in a manufacturing process of the semiconductor device.

Next, as shown in FIG. 6, the contact regions 24 and the source regions 25 are formed using ion implantation technique. For example, magnesium is radiated for the contact regions 24, and silicon is radiated for the source regions 25. Next, as shown in FIG. 7, the insulation gate section 36 is formed on parts of the front surface of the nitride semiconductor layer 20. Lastly, the drain electrode 32 and the source electrode 34 are laminated, which completes the semiconductor device 1 shown in FIG. 1.

(Variation)

Figure 8:
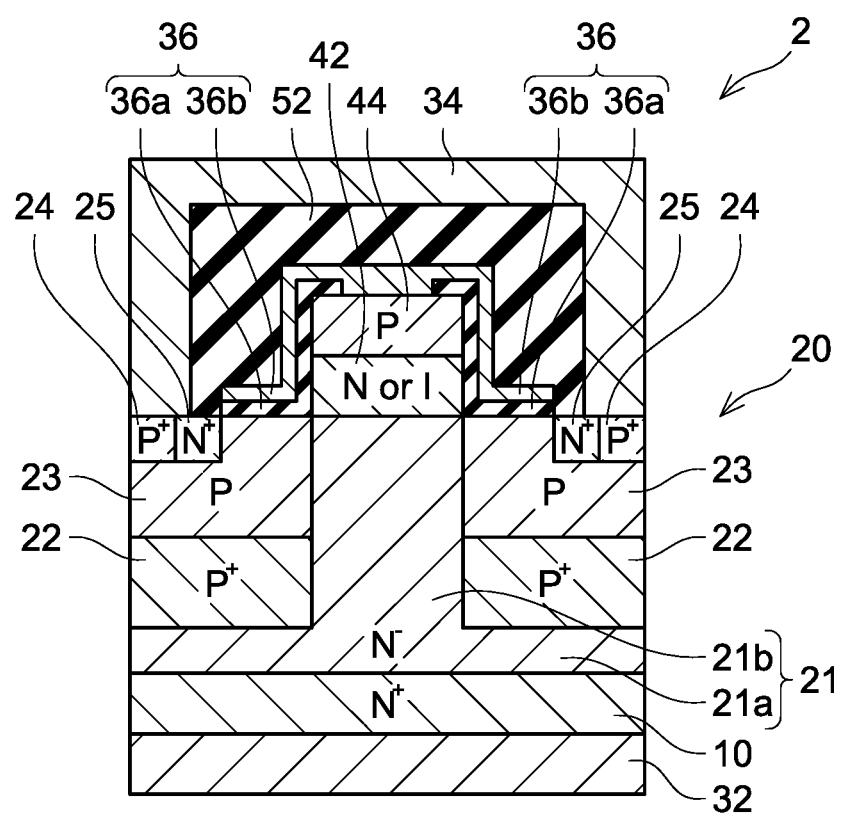
FIG. 8 schematically shows a cross sectional view of a main part of a semiconductor device according to a variation.

A semiconductor device 2 of a variation shown in FIG. 8 is characterized in further comprising a surface covering region 44. The surface covering region 44 is stacked on the surface of the heterojunction region 42. The surface covering region 44 is made of p-type gallium nitride (GaN). The gate electrode 36b is in ohmic or Schottky contact with a surface of the surface covering region 44 via the gap in the gate insulation film 36a.

When the semiconductor device 2 is of a potential of the surface covering region 44 becomes substantially equal to a ground potential of the gate electrode 36b, a junction surface between the surface covering region 44 and the heterojunction region 42 is reversely biased, and a depletion layer extends from the surface covering region 44 toward the heterojunction region 42. Due to this depletion layer, the two-dimensional electron gas in the front surface portion of the vertical drift region 21b disappears. In the aforementioned semiconductor device 1, a negative voltage needs to be applied to the gate electrode 36b in order to cause the two-dimensional electron gas to disappear when the semiconductor device 1 is off. By contrast, due to the surface covering region 44 being provided in the semiconductor device 2, it is possible to cause the two-dimensional electron gas to disappear when the gate electrode 36b is grounded, that is, when the semiconductor device 2 is off. Due to this, a drive device for driving the 16 semiconductor device 2 does not need to generate the negative voltage, and thus the drive device may comprise a simple circuit to drive the semiconductor device 2.

Some of the technical elements disclosed herein will be listed hereinbelow. It should be noted that the respective technical elements are independent of one another, and are useful solely or in combinations. The combinations thereof are not limited to those described in the claims as originally filed.

A semiconductor device disclosed herein may comprise a nitride semiconductor layer; an insulation gate section provided on a part of one of main surfaces of the nitride semiconductor layer, and a heterojunction region provided on another part of the one of main surfaces. The nitride semiconductor layer may include an n-type drift region, a p-type channel region, and an n-type source region. The drift region includes a vertical drift region disposed at the one of main surfaces. The channel region is intervened by the vertical drift region (is arranged at a position adjoining the vertical drift region), and disposed at the one of main surfaces. The source region is separated from the vertical drift region by the channel region, and disposed at the one of main surfaces. The insulation gate section is opposed to a portion of the channel region that separates the vertical drift region and the source region. Other layer may intervene between the insulation gate section and the nitride semiconductor layer. The heterojunction region is in contact with at least a part of a portion of the vertical drift region that is disposed at the one of main surfaces and the heterojunction region is an n-type nitride semiconductor or an i-type nitride semiconductor having a bandgap wider than a bandgap of the vertical drift region.

In the above-described semiconductor device, the heterojunction region may be in contact with an entirety of the portion of the vertical drift region which is at the one of main surfaces. In this case, since two-dimensional electron gas is generated over a broad range in a front surface portion of the vertical drift region, the semiconductor device can have a lower on-resistance.

The above-described semiconductor device may further comprise a surface covering region which is a p-type nitride semiconductor and provided on the heterojunction region. The surface covering region is electrically connected to a gate electrode of the insulation gate section. According to this semiconductor device, it is possible to cause the two-dimensional electron gas in the front surface portion of the vertical drift region to disappear when the semiconductor device is off. Due to this, the vertical drift region can be favorably pinched off.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
   a nitride semiconductor layer;
   an insulation gate section provided on a part of one of main surfaces of the nitride semiconductor layer, wherein the one of main surfaces of the nitride semiconductor layer is a flat surface; and
   a heterojunction region provided on another part of the one of main surfaces,
   wherein
   the nitride semiconductor layer comprises:
      an n-type vertical drift region disposed at the one of main surfaces;
      a p-type channel region adjoining the n-type vertical drift region, and disposed at the one of main surfaces; and an n-type source region separated from the n-type vertical drift region by the channel region, and disposed at the one of main surfaces;

the insulation gate section is opposed to a portion of the p-type channel region that separates the n-type vertical drift region and the source region;

the heterojunction region is in contact with at least a part of a portion of the n-type vertical drift region that is disposed at the one of main surfaces;

the heterojunction region is an n-type nitride semiconductor or an i-type nitride semiconductor having a bandgap wider than a bandgap of the n-type vertical drift region;

the n-type vertical drift region, a part of the p-type channel region, and the n-type source region are arranged in a lateral direction at the one of main surfaces of the nitride semiconductor layer; and the heterojunction region is not in direct contact with the n-type source region; and a junction between the heterojunction region and the n-type vertical drift region, a part of the one of main surfaces where the n-type source region is disposed at, and a part of the one of main surfaces where the p-type channel region is disposed at are in a same plane.

2. The semiconductor device of claim 1, wherein the heterojunction region is in contact with an entirety of the portion of the n-type vertical drift region which is disposed at the one of main surfaces.

3. The semiconductor device of claim 1, further comprising a surface covering region being a p-type nitride semiconductor, and provided on the heterojunction region, wherein the surface covering region is electrically connected to a gate electrode of the insulation gate section.

4. A method for manufacturing the semiconductor device according to claim 1, the method comprising:

forming a heterojunction layer on one of main surfaces of an n-type nitride semiconductor layer, the heterojunction layer being an n-type nitride semiconductor or an i-type nitride semiconductor which has a bandgap wider than a bandgap of the nitride semiconductor layer;

etching a part of the heterojunction layer so as to form the heterojunction region in heterojunction with the nitride semiconductor layer, and so as to expose the one of main surfaces of the nitride semiconductor layer at a position adjoining the heterojunction region;

forming the channel region at the one of main surfaces by radiating p-type impurities to the one of main surfaces that was exposed in the etching;

forming the source region at the one of main surfaces by radiating n-type impurities to a part of the nitride semiconductor layer disposed at the one of main surfaces within the channel region; and forming the insulation gate section on the one of main surfaces.

* * * * *